United States Patent
Shiraishi et al.

(10) Patent No.: US 7,508,057 B2
(45) Date of Patent: Mar. 24, 2009

(54) ELECTRONIC COMPONENT DEVICE

(75) Inventors: Akinori Shiraishi, Nagano (JP); Kei Murayama, Nagano (JP); Yuichi Taguchi, Nagano (JP); Masahiro Sunohara, Nagano (JP); Mitsutoshi Higashi, Nagano (JP)

(73) Assignee: Shinko Electric Industries, Co., Ltd., Nagano-shi (JP)

( * ) Notice: Subject to any disclaimer, the term of this patent is extended or adjusted under 35 U.S.C. 154(b) by 31 days.

(21) Appl. No.: 11/892,069

(22) Filed: Aug. 20, 2007

(65) Prior Publication Data
US 2008/0073768 A1 Mar. 27, 2008

(30) Foreign Application Priority Data
Sep. 22, 2006 (JP) ............................. 2006-257415

(51) Int. Cl.
*H01L 23/06* (2006.01)
(52) U.S. Cl. ...................................... 257/684; 257/698
(58) Field of Classification Search ................. 257/684, 257/698
See application file for complete search history.

(56) References Cited

U.S. PATENT DOCUMENTS

| 6,969,639 | B2 * | 11/2005 | Cho et al. ................... 438/118 |
| 7,005,320 | B2 * | 2/2006 | Kwon ......................... 438/108 |
| 7,026,223 | B2 * | 4/2006 | Goodrich et al. ............ 438/456 |
| 2004/0178462 | A1 | 9/2004 | Sakaguchi et al. | |

FOREIGN PATENT DOCUMENTS

JP 2004-281530 10/2004

* cited by examiner

*Primary Examiner*—Douglas M Menz
(74) *Attorney, Agent, or Firm*—Kratz, Quintos & Hanson, LLP

(57) ABSTRACT

An electronic component device of the present invention includes: a silicon package unit having a structure in which a through electrode provided to a silicon substrate while an electrode post connected to the through electrode is provided upright on an upper side of the silicon substrate; an electronic component mounted on the electrode post and having a connection terminal connected to the top end of the electrode post; and a cap package unit joined onto a periphery of the silicon package unit, and constructing a housing portion in which the electronic component is housed to be hermetically sealed.

10 Claims, 8 Drawing Sheets

ELECTRONIC COMPONENT DEVICE

CROSS-REFERENCE TO RELATED APPLICATIONS

This application is based on and claims priority of Japanese Patent Application No. 2006-257415 filed on Sep. 22, 2006, the entire contents of which are incorporated herein by reference.

BACKGROUND OF THE INVENTION

1. Field of the Invention

The present invention relates to an electronic component device, and more particularly relates to an electronic component device composed to be mounted in a state that an electronic component is hermetically sealed in a package.

2. Description of the Related Art

In the prior art, there has been an electronic component device composed to be mounted in a state that an electronic component is hermetically sealed in a package. As shown in FIG. 1, in an example of an electronic component device in the prior art, a frame-shaped ceramic portion 250 is provided upright on a periphery of a lower ceramic base 100. Electrodes 120 are provided to a pair of two opposite end sides of the lower ceramic base 100. Each of the electrodes 120 is continuously formed from one end of the upper surface of the lower ceramic base 100 to one end of the back surface thereof through the side thereof. Each of external connection terminals 140 is disposed on one end of the back surface of the lower ceramic base 100.

A driver IC 200 is fixed with a die attach material 160 on the lower ceramic base 100. Further, an MEMS device 300 is mounted on the driver IC 200. A connection terminal 300a of the MEMS device 300 is connected to a first connection terminal 200a of the driver IC 200 through a wire 220. In addition, a second connection terminal 200b of the driver IC 200 is connected, through a wire 220a, to one of the electrodes 120 provided on the lower ceramic base 100.

Additionally, a housing portion S is constructed by fixing an upper ceramic base 400 onto the frame-shaped ceramic portion 250 by Au—Sn bonding. Thereby, the Driver IC 200 and the MEMS device 300 are mounted in a state that they are hermetically sealed in the housing portion S.

As a technique related to such an electronic component device, In Patent Literature 1 (Japanese Patent Application Laid-open Publication No. 2004-281530) discloses a technique for fixing a light-emitting device onto a substrate with a bump, in a semiconductor device in which the light-emitting device is mounted to be hermetically sealed in a package.

However, in the above electronic component device in the prior art, the upper ceramic base 400 made into a unit piece is joined to the frame-shaped ceramic portion 250, after an electronic component is mounted on the package which is also made into a unit piece, in which the frame-shaped ceramic portion 250 is provided upright on the lower ceramic base 100. Consequently, manufacturing such an electronic component device requires a lot of processes, and this leads to not only poor productivity but also increase of manufacturing costs easily.

Also, since the driver IC 200 is connected to the electrode 120 provided on the lower ceramic base 100 via the wire 220a, it is necessary to secure an area where makes the wire 220a pass between the driver IC 200 and the electrode 120, thereby, it cannot easily satisfy demands for miniaturization of an electronic component device.

SUMMARY OF THE INVENTION

It is an object of the present invention to provide an electronic component device which enables achievement of high productivity and miniaturization, in an electronic component device in which an electronic component is mounted to be hermetically sealed in a package.

The present invention relates to an electronic component device which includes: a silicon package unit including a silicon substrate, a through electrode provided in the silicon substrate, and an electrode post provided upright on the upper surface of the silicon substrate and connected to the through electrode; an electronic component mounted on the electrode post and having a connection terminal connected to a top end of the electrode post; and a cap package unit joined onto a periphery of the silicon package unit, thereby forming a housing portion having the electronic component housed therein while being hermetically sealed.

In the silicon package unit of the electronic component device according to the present invention, the through electrode is provided in the silicon substrate, and the electrode post connected to the through electrode is formed to stand upright on the upper surface of the silicon substrate. The electronic component is mounted on the through electrode, and a connection terminal of the electronic component is directly connected to the top end of the electrode post. In addition, the cap package unit constructing the housing portion in which the electronic component is housed to be hermetically sealed is joined onto the periphery of the silicon package unit.

In this way, the electronic component is mounted in the package in a state that it is hermetically sealed in housing portion composed of the silicon package unit and the cap package unit.

In the present invention, the connection terminal of the electronic component is directly connected to the electrode post, and it is not necessary to secure an area for connecting with a wire on the silicon package unit. Thus, the electronic component device can be made smaller than that fabricated with the prior art.

Additionally, the electronic component device of the present invention is obtained as follows. First, the electronic components are mounted onto the electrode posts formed in the respective device mounting areas of the silicon wafer. Then, the electronic component is hermetically sealed with the cap substrate. After that, the silicon wafer and the cap substrate are divided into the electronic component devices. In this way, the assembly of the electronic component devices is carried out at a wafer level. This manufacturing method achieves an improvement of production efficiency and a reduction of manufacturing costs as compared with the method of mounting electronic components on a package made into a unit piece.

Moreover, the silicon package unit is used as an interposer on which the electronic component is mounted. Accordingly, the thermal expansion coefficients of the silicon package unit and the electronic component (silicon chip) can be set to the same value. As a result, generation of thermal stress is suppressed, so that the reliability of the electronic component device can improve.

In a preferred mode of the present invention, the cap package unit is formed of a top plate (glass, silicon, ceramic or the like) and a frame-shaped silicon portion joined onto a periphery of the lower surface of the top plate, while a lower part of the frame-shaped silicon portion is joined onto the silicon package unit.

Alternatively, the following structure may be employed. In each of the silicon package unit and the cap package unit, a concave portion is provided in a central main portion thereof and a protruding joint portion is formed on a periphery thereof. Then, the protruding joint portion of the cap package unit is joined onto the protruding joint portion of the silicon package unit, and thereby the housing portion is composed of the two concave portions.

As described above, the electronic component device according to the present invention enables achievement of high productivity and miniaturization as well as achievement of high reliability by suppressing thermal stress generation.

DESCRIPTION OF THE PREFERRED EMBODIMENTS

With reference to the appended drawings, embodiments of the present invention will be described below.

First Embodiment

Figure 1:
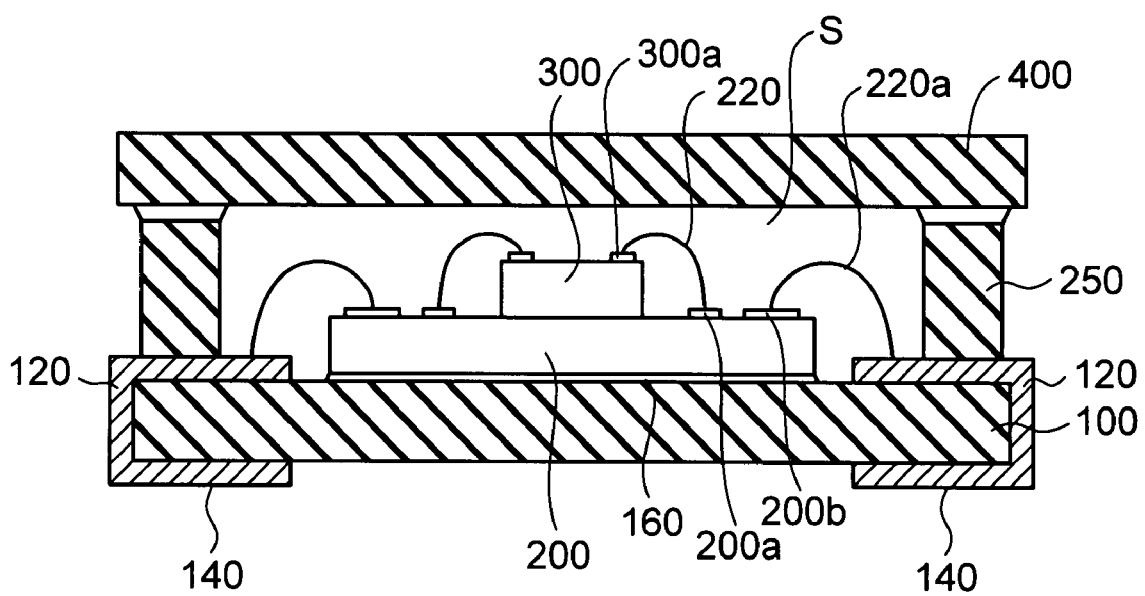
FIG. 1 is a cross-sectional view for showing an example of an electronic component device in the prior art.
Figure 2A:
FIGS. 2A to 2L are cross-sectional views for showing a method of manufacturing an electronic component device according to a first embodiment of the present invention.
Figure 2B:
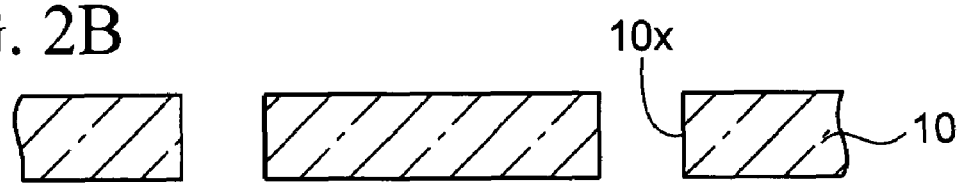
Figure 2C:
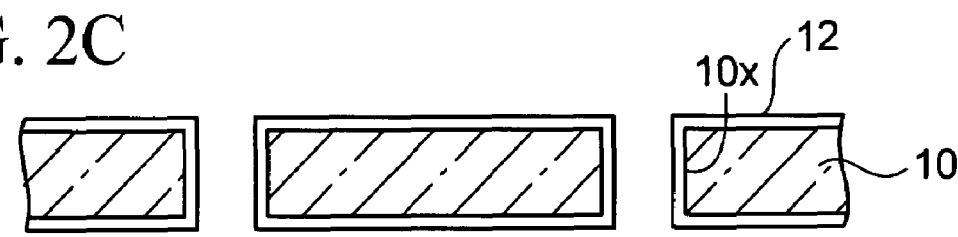
Figure 2D:
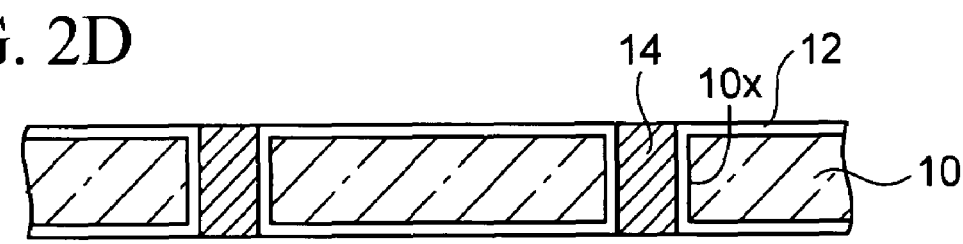
Figure 2E:
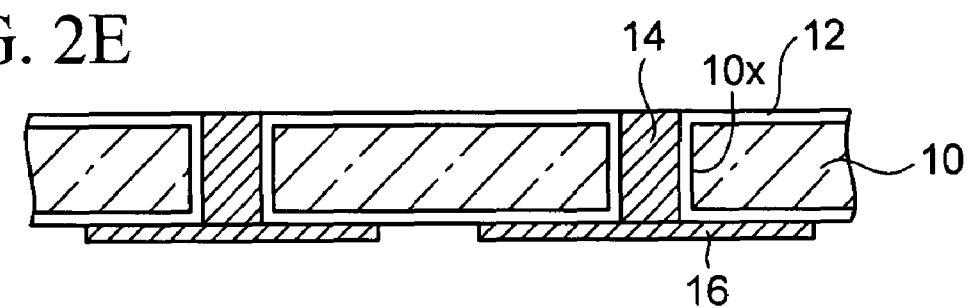
Figure 2F:
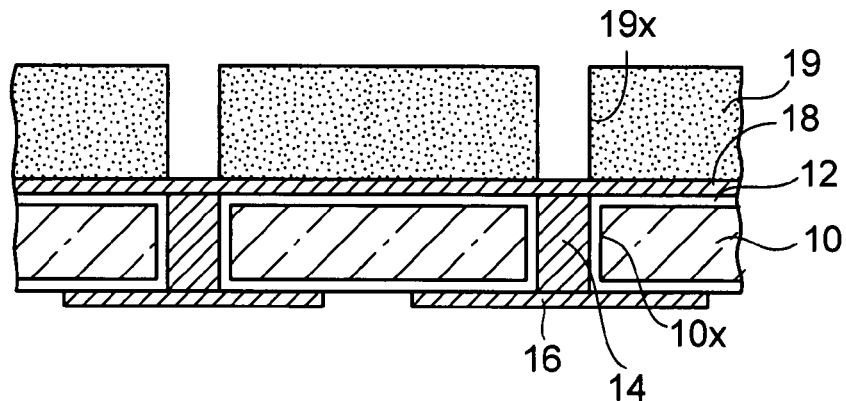
Figure 2G:
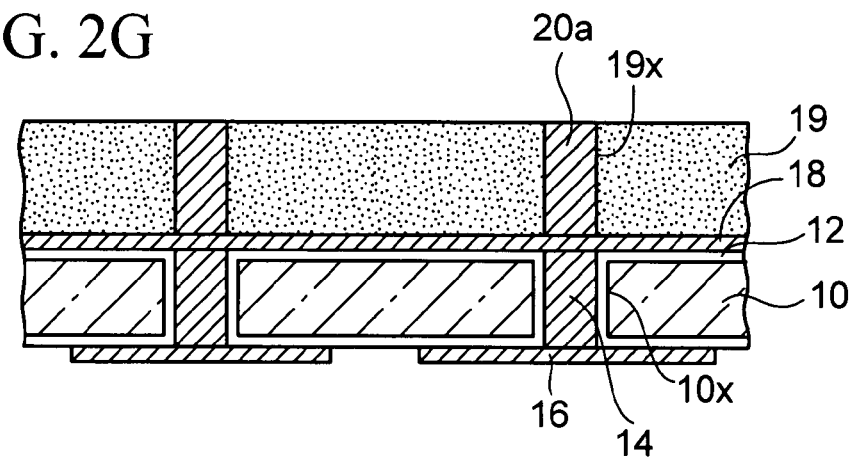
Figure 2H:
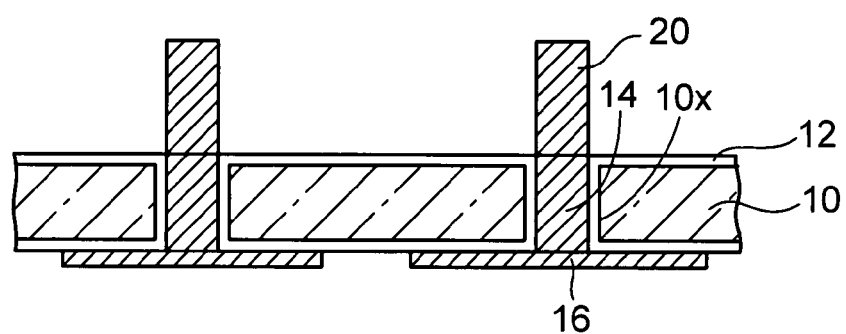
Figure 2I:
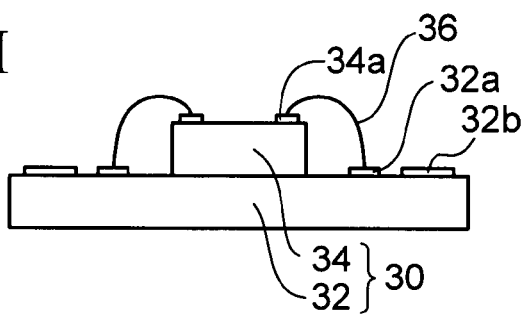
Figure 2J:
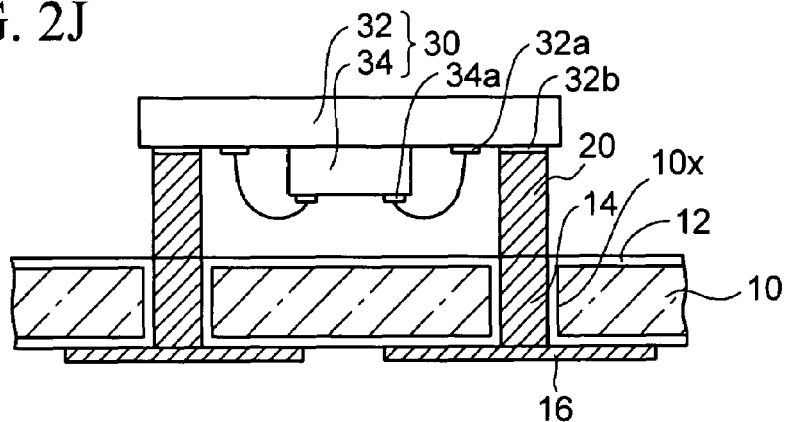
Figure 2K:
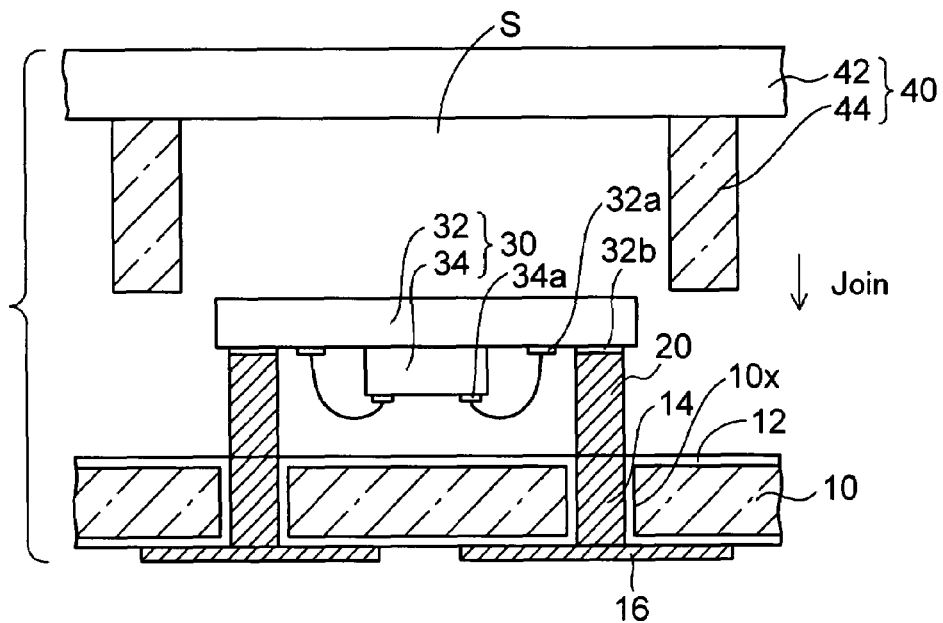
Figure 2L:
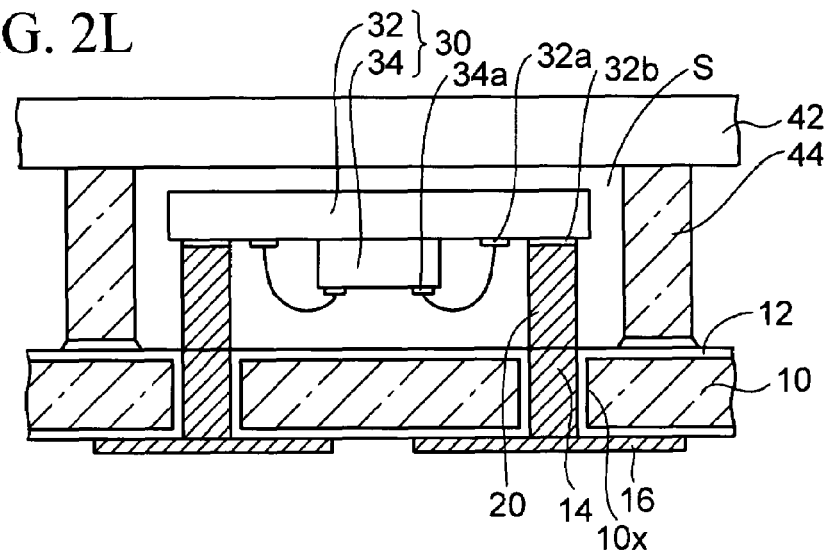
Figure 3:
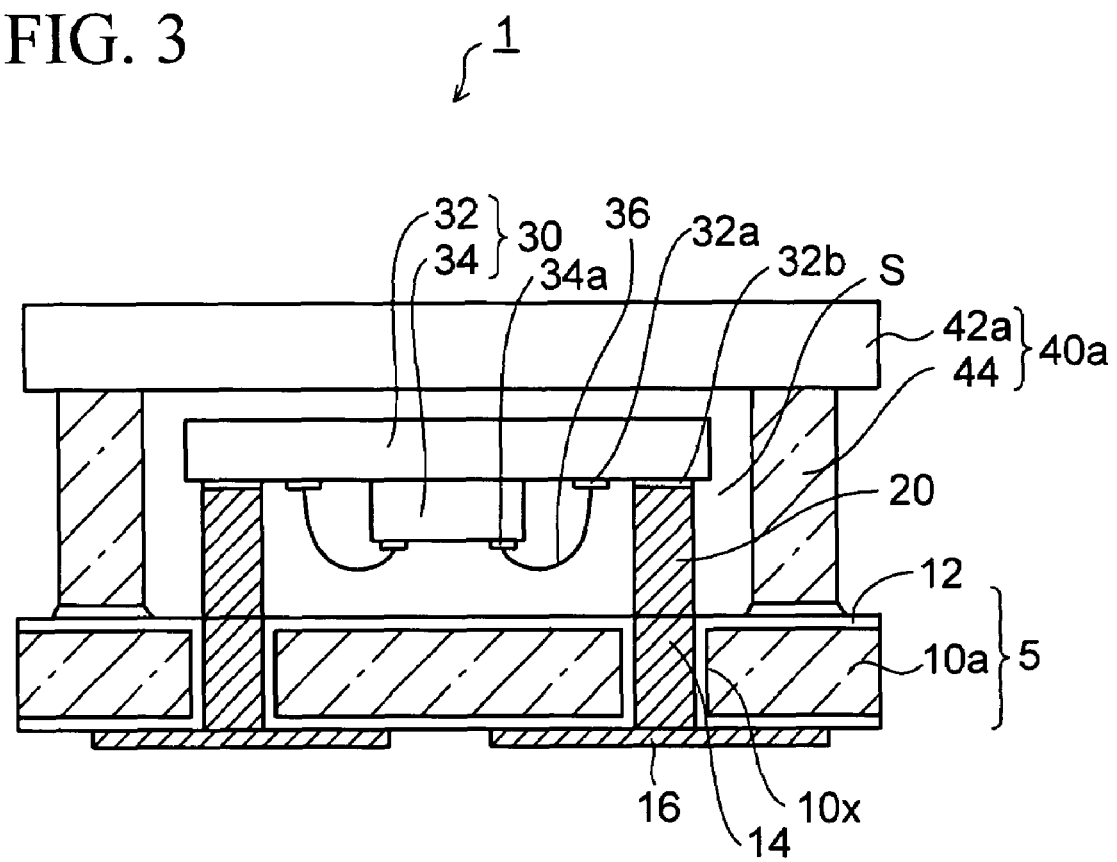
FIG. 3 is a cross-sectional view for showing the electronic component device according to the first embodiment of the present invention.

FIGS. 2A to 2L are cross-sectional views for showing a method of manufacturing an electronic component device according to a first embodiment of the present invention, and FIG. 3 is a cross-sectional view for showing the electronic component device according to the first embodiment of the present invention.

In the method of manufacturing an electronic component device according to the first embodiment of the present invention, first of all, silicon wafer 10 having a thickness of 200 to 300 μm is prepared as shown in FIG. 2A. This silicon wafer 10 is obtained by grinding and thinning a silicon wafer having a thickness on the order of 625 μm with a back grinder (BG) to have a predetermined thickness. A plurality of device mounting areas are defined on the silicon wafer 10, and each of the electronic component devices is obtained by dividing the silicon wafer 10 into the plurality of device mounting areas in a downstream process.

Then, as shown in FIG. 2B, a mask (not illustrated) having required opening portions is formed on the silicon wafer 10 by photolithography. The silicon wafer 10 is dry-etched through the opening portions, thereby each of through holes 10x that penetrates through the silicon wafer 10 in a thickness direction is formed. Thereafter, the mask is removed.

Moreover, as shown in FIG. 2C, by thermally oxidizing the silicon wafer 10, an insulating layer 12 composed of an oxidized silicon layer having a film thickness on the order of 500 nm is formed on both surfaces of the silicon wafer 10 and on the inner surface of the through hole 10x. Alternatively, the insulating layer 12 may be formed in a way that an oxidized silicon layer or a nitrided silicon layer is formed all over the surface of the silicon wafer 10 by CVD.

Next, as shown in FIG. 2D, each of through electrodes 14 made of copper or the like is buried and formed in the through hole 10x of the silicon wafer 10. More precisely, a power supply member for plating is disposed on the lower side of the silicon wafer 10, for example, and then copper plating is applied to the through hole 10x from the bottom to the top by electroplating. In this way, the through electrode 14 is formed.

Then, as shown in FIG. 2E, a copper layer is formed on the lower surface of the silicon wafer 10 by sputtering, and then is patterned by photolithography and etching. Thus, a wiring pattern 16 connected to the through electrode 14 is formed on the insulating layer 12 on the lower surface of the silicon wafer 10. Incidentally, various methods such as a semi-additive method may be adopted for forming the wiring pattern 16.

Subsequently, as shown in FIG. 2F, a seed layer 18 made of copper is formed on the upper surface of the structure in FIG. 2E. Thereafter, a resist 19 is formed on the seed layer 18, and the resist 19 is provided with an opening portion 19x located at a position corresponding to the through electrode 14. In addition, as shown in FIG. 2G, each of metal posts 20a is formed by applying copper plating to the opening portion 19x of the resist 19 by electroplating with the seeding layer 18 used as a power supply path for plating. Then, Ni/Au plating is applied to the top end of the metal posts 20a. The Ni/Au plating is constructed by stacking a Ni layer and a Au layer sequentially from the low side. And thus a connection portion (not illustrated) is formed.

Next, as shown in FIG. 2H, after the resist 19 is removed, each of electrode posts 20 is formed by etching the seed layer 18 while utilizing the metal posts 20a as a mask. The electrode post 20 is provided upright on the upper surface of the silicon wafer 10 and connected to the through electrode 14. The electrode posts 20 are each disposed so as to correspond to a connection terminal of a semiconductor chip that will be described later. Incidentally, electrode posts 20 each connected to a through electrode 14 are formed on each of the plurality of device mounting areas on the silicon wafer 10.

Then, an electronic component 30 is prepared as shown in FIG. 2I. The electronic component 30 illustrated in the present embodiment is constructed by mounting an MEMS (Micro Electro Mechanical Systems) device 34 on a control semiconductor chip 32 (such as a driver IC), and a connection terminal 34a of the MEMS device 34 is connected to a first connection terminal 32a of the control semiconductor chip 32 through a wire 36. The control semiconductor chip 32 has a second connection terminal 32b to be connected to an electrode of a package. Ni/Au plating is applied to the surface of the second connection terminal 32b.

Next, as shown in FIG. 2J, the electronic component 30 in FIG. 2I is inverted upside down, and thus is mounted by connecting each second connection terminal 32b of the control semiconductor chip 32 to the top end of the above-described electrode posts 20 in FIG. 2H by thermocompression bonding. Thus, the MEMS device 34 of the electronic component 30 is disposed in a space inside the plurality of electrode posts 20. In this way, the electronic component 30 is directly connected to the electrode posts 20 protruding from the silicon wafer 10 without using a wire.

Then, a cap substrate 40 is prepared as shown in FIG. 2K. More precisely, the cap substrate 40 has a structure in which a frame-shaped silicon portion 44 is joined onto one surface of a glass wafer 42 by anode-bonding, thereby provided with a plurality of housing portions S (cavities). On the cap substrate 40, the plurality of housing portions S (cavities) are constructed by the frame-shaped silicon portion 44 so as to correspond to the respective device mounting areas on the above-described silicon wafer 10.

After that, the lower part of the frame-shaped silicon portion 44 of the cap substrate 40 is fixed onto the insulating layer 12 on the silicon wafer 10 by Au—Sn bonding. Thus, as shown in FIG. 2L, it becomes a condition that the electronic component 30 is hermetically sealed in the housing portions S composed of the silicon wafer 10 and the cap substrate 40. Alternatively, the glass wafer 42 may be joined onto the frame-shaped silicon portion 44 by anode-bonding after the frame-shaped silicon portion 44 is joined onto the insulating layer 12 on the silicon wafer 10. Moreover, the electronic component 30 may be hermetically sealed in the in housing portion S with a vacuum state, or an ambient atmosphere or an inert gas atmosphere.

Thereafter, as shown in FIG. 3, the structure in FIG. 2L is cut and divided so as to obtain each of the device mounting areas of the silicon wafer 10, and thereby the electronic component device 1 made into a unit piece according to the present embodiment is obtained. At this time, the silicon wafer 10 provided with the through electrodes 14 and the electrode posts 20 and the like is divided into a unit piece and the silicon package unit 5 is obtained, and the cap substrate 40 is divided into a unit piece and the cap package unit 40a is obtained.

As shown in FIG. 3, the electronic component device 1 according to the present embodiment is basically composed of the silicon package unit 5, the electronic component 30 mounted on the electrode posts 20 disposed on the silicon package unit 5, and the cap package unit 40a constructing the housing portion S in which the electronic component 30 is housed to be hermetically sealed. In the silicon package unit 5, the through hole 10x is provided in the silicon substrate 10a, and the insulating layer 12 made of the oxidized silicon layer and the like is formed on both surfaces of silicon substrate 10a as well as on the inner surface of the through hole 10x.

The through electrode 14 made of copper and the like is filled in the through hole 10x, and the electrode post 20 connected to the through electrode 14 is provided upright on the upper surface of the silicon substrate 10a. The height of the electrode post 20 is set in the range of 200 to 400 μm (preferably on the order of 300 μm). In addition, the wiring pattern 16 connected to the through electrode 14 is provided on (on the lower side, in FIG. 3) the insulating layer 12 on the lower surface side of the silicon substrate 10a. The wiring pattern 16 functions as an external connection terminal.

The electronic component 30 is constructed by mounting the MEMS device 34 on (on the lower side, in FIG. 3) the control semiconductor chip 32. In the electronic component 30, the connection terminals 34a of the MEMS device 34 are connected to the first connection terminals 32a of the control semiconductor chip 32 with the wires 36. The control semiconductor chip 32 has the second connection terminals 32b on peripheral portions thereof, and the second connection terminals 32b are directly connected to the top ends of the electrode posts 20.

In this way, the electronic component 30 is mounted on a position away from the silicon substrate 10a to the upper side by virtue of the electrode posts 20, and the MEMS device 34 is disposed in a space inside the plurality of the electrode posts 20.

An acceleration sensor, a gyro sensor, a switch device and the like are used as the MEMS device 34, and the MEMS device 34 is controlled by the control semiconductor chip 32.

Although the two devices stacked on each other are illustrated as the electronic component 30, any type of electronic component may be used as long as the electronic component having a structure in which an external connection terminal is connected to an electrode post.

In addition, the cap package unit 40a is disposed on the silicon package unit 5 such that the housing portion S in which the electronic component 30 is housed is constructed. The cap package unit 40a is composed of the glass substrate 42a and the frame-shaped silicon portion 44 which is joined onto a periphery of the lower surface of the glass substrate 42a by anode-bonding. And the lower part of the frame-shaped silicon portion 44 is fixed by Au—Sn bonding onto the insulating layer 12 on the periphery of the silicon package unit 5. The height of frame-shaped silicon portion 44 is on the order of 500 μm in a case where the height of the electrode post 20 is 300 μm. The heights of the electrode post 20 and the frame-shaped silicon portion 44 are adjusted as appropriate in response to the structure of the electronic component 30.

In this way, the electronic component 30 mounted onto the electrode post 20 on the silicon package unit 5 is hermetically sealed to be housed in housing portion S composed of the silicon package unit 5 and the cap package unit 40a.

In addition, instead of using the above-described the cap package unit 40a in which the frame-shaped silicon portion 44 is joined onto the periphery of the lower surface of the glass substrate 42a (a top plate), the cap package unit in which a silicon substrate or a ceramic substrate is used as a top plate, and a frame-shaped silicon portion is joined onto a periphery of the lower surface thereof may be used.

Also, although the electrode post 20 is formed by copper plating, the electrode post 20 may also be formed of various metals such as solder, tin, nickel and gold. Alternatively, the electrode post 20 may be formed of silicon. In this case, a polysilicon layer doped with conductive impurity is formed by CVD on the silicon wafer 10 provided with the though electrode 14, and then the electrode post 20 is formed by patterning the polysilicon layer. Moreover, the though electrode 14 and the wiring pattern 16 may also be formed of silicon in addition to the electrode post 20.

In the silicon package unit 5 of the electronic component device 1 according to the present embodiment, the electrode post 20 protruding from the upper surface of the silicon substrate 10a and the wiring pattern 16 disposed on the lower surface thereof are connected to each other via the through electrode 14, and then the electronic component 30 is mounted on the silicon package unit 5 such that the second connection terminals 32b of the electronic component 30 is directly connected to the electrode posts 20. By employing such constitutions, there is no need to secure an area for connecting the electronic component 30 through a wire, on the silicon package unit 5. Accordingly, the electronic component can be made small as compared with a case of the prior art.

In addition, the silicon package unit 5 having electrical continuity between both surfaces thereof is obtained by forming the fine through hole 10x in the silicon wafer 10 on the basis of photolithography, and then forming the though electrode 14 in the through hole 10x. With this manufacturing method, the pitch of an electrode to be connected to an electronic component can be made smaller and the length of wiring can be made shorter than the prior art. Thus, it is able to cope with mounting a high-performance electronic component.

Moreover, as described above, the electronic component device 1 according to the present embodiment is manufactured in the following manner. First, the electronic components 30 are connected to the electrode posts 20 formed in the device mounting areas of the silicon wafer 10 respectively. Second, the electronic components 30 are hermetically sealed with the cap substrate 40. Thereafter, finally, the silicon wafer 10 and the cap substrate 40 are divided into the electronic component devices 1. Since the assembly is performed at a wafer level in this way, this manufacturing method achieves an improvement of production efficiency and a reduction of manufacturing costs as compared with the method of mounting electronic components on the packages made into a unit piece.

Furthermore, the electronic component 30 is mounted on the silicon package unit 5. Accordingly, when a silicon chip is used as an electronic component, the silicon package unit 5 and the electronic component can have the same thermal expansion coefficient. As a result, generation of thermal stress is suppressed, so that the reliability of the electronic component device can improve. From such a viewpoint, it is preferable that a whole of the package is constructed from silicon by forming the top plate of the cap package unit 40a by using silicon. Incidentally, when the electrode post 20 is form of silicon, generation of thermal stress is further suppressed.

Embodiment 2

Figure 4A:
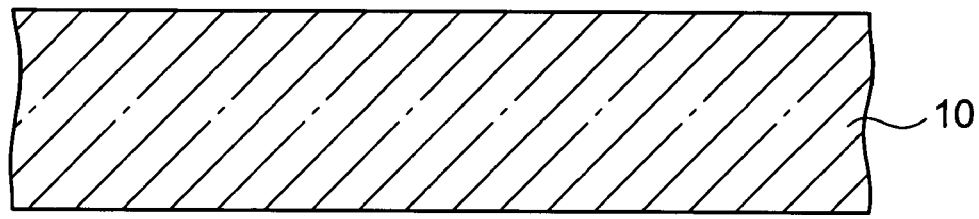
FIGS. 4A to 4G are cross-sectional views for showing a method of manufacturing an electronic component device according to a second embodiment of the present invention.
Figure 4B:
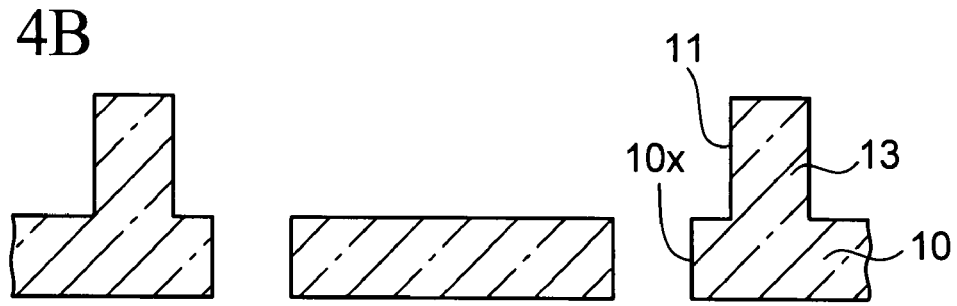
Figure 4C:
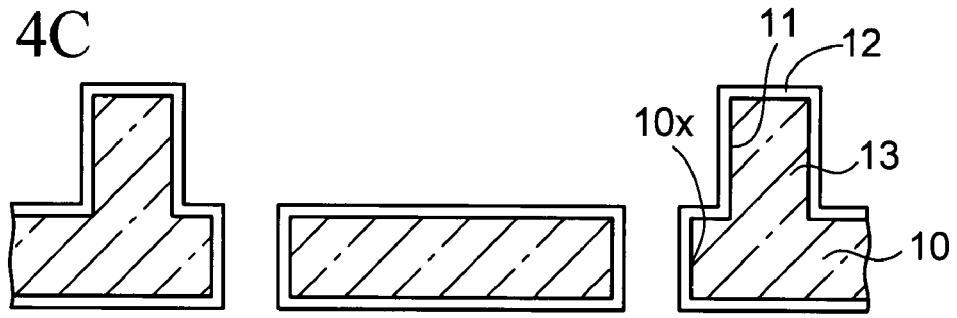
Figure 4D:
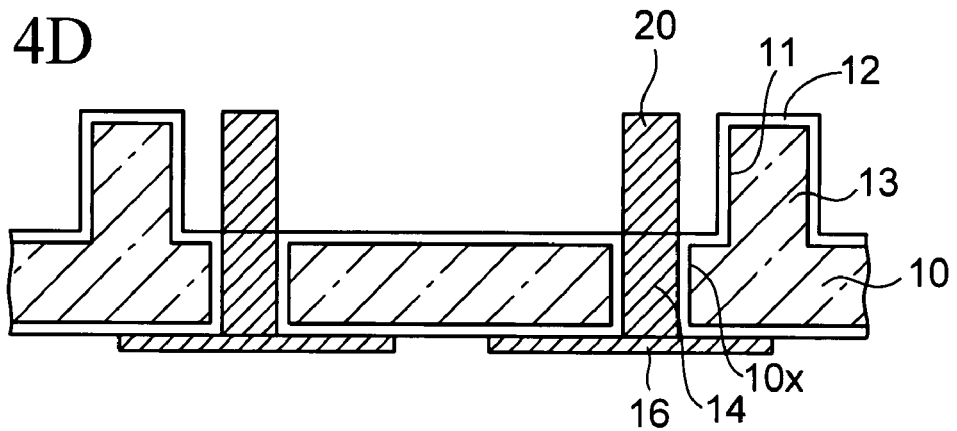
Figure 4E:
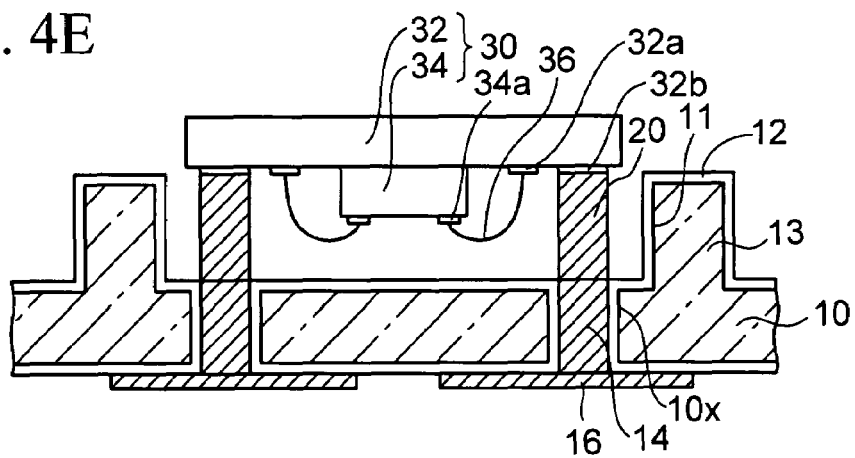
Figure 4F:
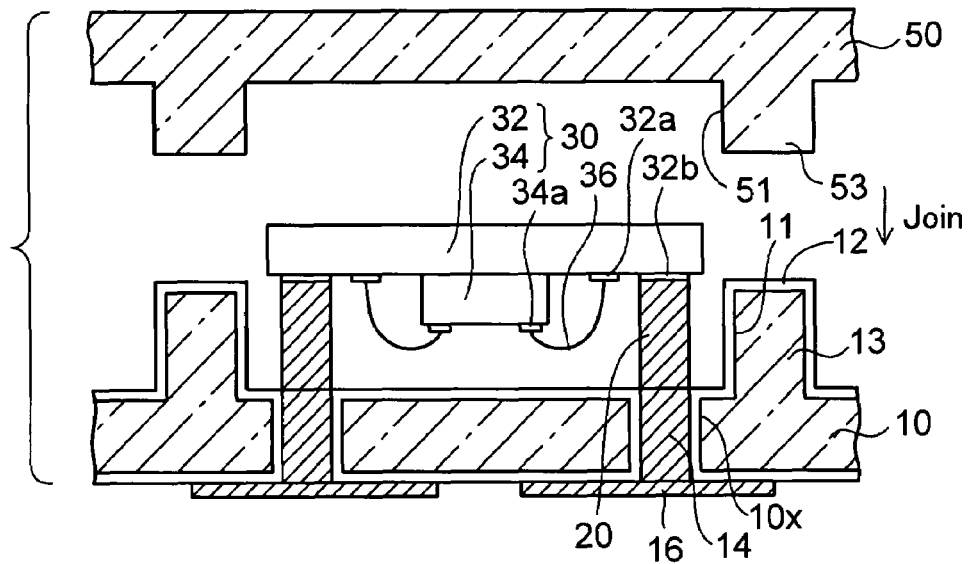
Figure 4G:
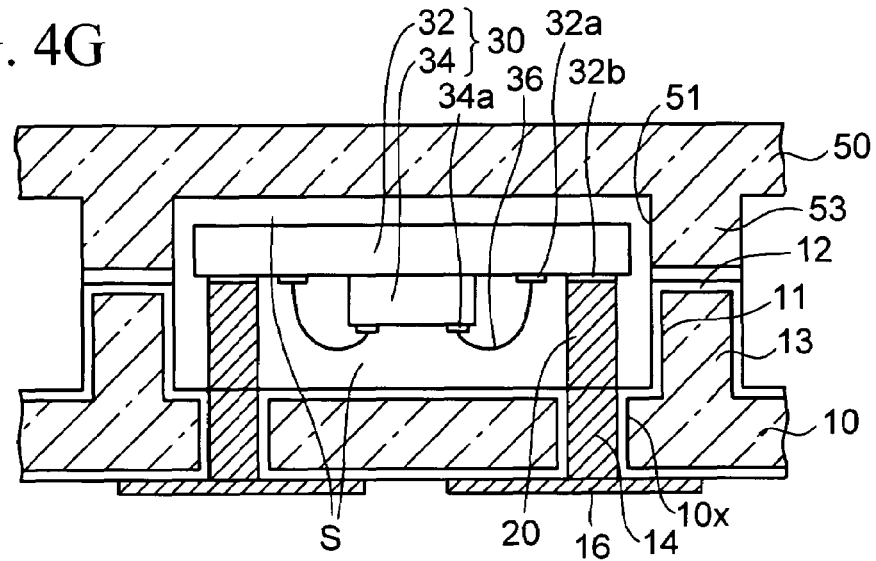
Figure 5:
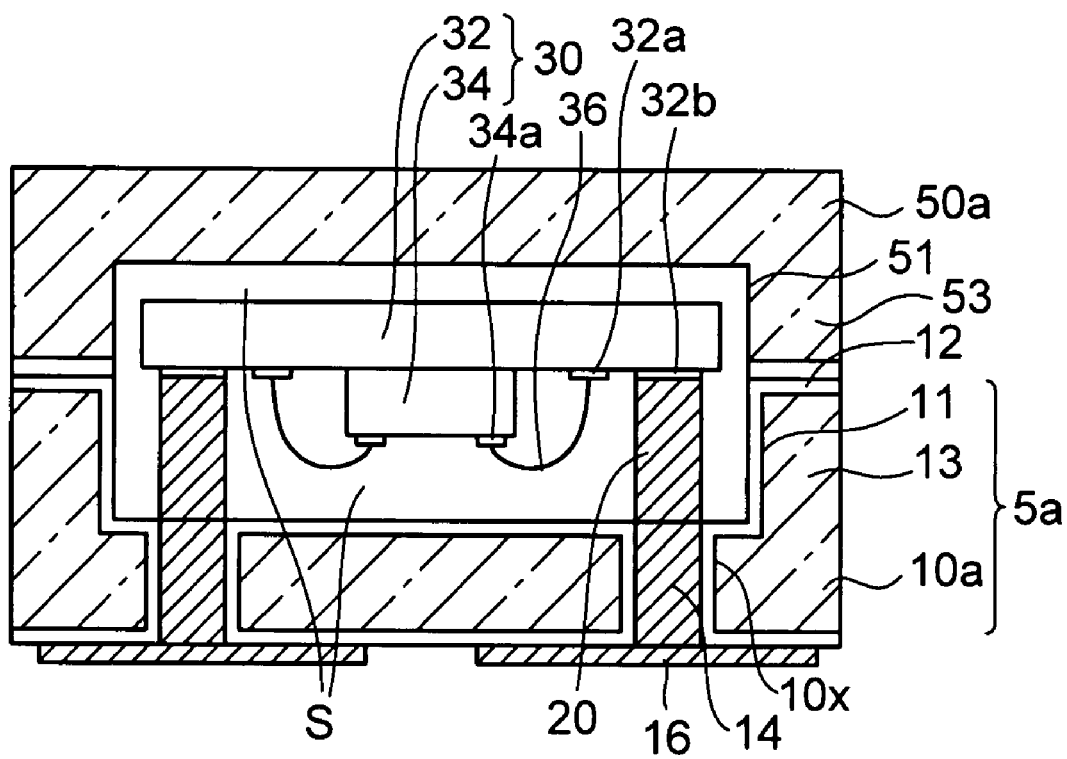
FIG. 5 is a cross-sectional view for showing the electronic component device according to the second embodiment of the present invention.

FIGS. 4A to 4G are cross-sectional views for showing a method of manufacturing an electronic component device according to a second embodiment of the present invention, and FIG. 5 is a cross-sectional view for showing the electronic component device of the second embodiment. The second embodiment is different from the first embodiment in that a concave portion is provided in a silicon package unit, and that a cap package unit is integrally formed.

In the method of manufacturing the electronic component device according to the second embodiment, as shown in FIG. 4A, first of all, a first silicon wafer 10 having a thickness on the order of 625 μm is prepared. After that, as shown in FIG. 4B, a mask member (not illustrated) is formed on the first silicon wafer 10, and this mask member has opening portions in a central main portion of each device mounting area. Then, the first silicon wafer 10 is etched through the opening portions of the mask member, and thereby concave portions 11 each having a depth of approximately 300 to 400 μm are formed. In this way, the concave portion 11 is formed in the central main portion of each device mounting area of the first silicon wafer 10, while protruding joint portions 13 are provided so as to define each device mounting area.

Moreover, as shown in FIG. 4B, required through holes 10x are formed in the bottom portion of the concave portion 11 of the first silicon wafer 10 by using the same method as in the first embodiment. Thereafter, as shown in FIG. 4C, an insulating layer 12 is formed on both the surfaces of the silicon wafer 10, and is formed on the inner surface of the concave portion 11 and the through hole 10x, by using the same method as in the first embodiment.

Subsequently, as shown in FIG. 4D, by using the same method as in the first embodiment, after the through electrodes 14 are formed in the through holes 10x, a wiring pattern 16 connected to the through electrode 14 is formed on the lower surface of the first silicon wafer 10. Thereafter, electrode posts 20 connected to the through electrodes 14 are provided upright on the upper surface of the first silicon wafer 10.

Next, as shown in FIG. 4E, an electronic component 30 having the same structure as the first embodiment is prepared. Then, second connection terminals 32b of a control semiconductor chip 32 are connected to the top ends of the electrode posts 20, and thereby the electronic component 30 is mounted.

Thereafter, as shown in FIG. 4F, a second silicon wafer 50 having a concave portion 51 and a protruding joint portion 53 corresponding to the concave portion 11 and the protruding joint portion 13 in each device mounting area of the first silicon wafer 10 respectively, is prepared. The concave portion 51 of the second silicon wafer 50 is formed by using the same method as that used for forming the concave portion 11 of the first silicon wafer 10. The depth of the concave portion 51 is set in the range of 200 to 300 μm.

Then, the second silicon wafer 50 is disposed so that the concave portion 51 is opposed to the concave portion 11 of the first silicon wafer 10. In this position, the protruding joint portions 53 of the second wafer 50 are fixed onto the insulating layers 12 on the protruding joint portions 13 of the first silicon wafer 10 by Au—Sn bonding.

In this way, as shown in FIG. 4G, a housing portion S is composed of the concave portion 11 of the first silicon wafer 10 and the concave portion 51 of the second silicon wafer 50, and thus the electronic component 30 is hermetically sealed to be housed in housing portion S.

After that, the structure in FIG. 4G is cut and divided such that each of device mounting areas of the first silicon wafer 10 is obtained. In this way, as shown in FIG. 5, the electronic component device 2 made into a unit piece according to the second embodiment is obtained. At this time, the first silicon wafer 10 provided with the through electrodes 14 and the electrode posts 20 and the like is divided into a unit piece and the silicon package unit 5a is obtained, and the second silicon wafer 50 is divided into a unit piece and the cap package units 50a is obtained.

As shown in FIG. 5, in the silicon package unit 5a of the electronic component device 2 according to the second embodiment, the concave portion 11 is formed on the upper surface of a silicon substrate 10a, and the protruding joint portion 13 is provided on a periphery of the silicon substrate 10a. The through hole 10x is provided in the bottom portion of the concave portion 11 of the silicon substrate 10a, and the through electrode 14 is provided in the through hole 10x via the insulating layer 12 interposed therebetween.

Further, as in the case of the first embodiment, the electrode post 20 connected to the through electrode 14 is provided upright on the upper surface of the silicon substrate 10a, while the wiring pattern 16 connected to the through electrode 14 is formed on the lower surface of the silicon substrate 10a. Moreover, as in the case of the first embodiment, the second connection terminals 32b of the control semiconductor chip 32 of the electronic component 30 is directly connected to the top ends of the electrode posts 20, and thereby the electronic component 30 is mounted.

In the cap package unit 50a, the concave portion 51 is formed on the lower surface thereof, while the protruding joint portion 53 is provided on the periphery thereof. Additionally, the protruding joint portion 53 of the cap package unit 50a is fixed onto the insulating layer 12 on the protruding joint portion 13 of the silicon package unit 5a by Au—Sn bonding.

In this way, the housing portion S is composed of the concave portion 11 of the silicon package unit 5a and the concave portion 51 of the cap package unit 50a, and the electronic component 30 is mounted to be hermetically sealed in housing portion S.

As a preferred example, the cap package unit 50a is formed of silicon. However, a glass substrate or a ceramic substrate having a concave portion on its lower surface may be used as the cap package unit 50a. In a case where the cap package unit 50a is formed of glass, the insulating layer 12 on the protruding joint portion 13 of the silicon package unit 5a is removed, and then a glass cap is fixed by anode-bonding onto the protruding joint portion 13 (silicon) of the silicon package unit 5a. In addition, in a case where the cap package unit 50a is formed of ceramic, a ceramic cap is fixed by Au—Sn bonding onto the insulating layer 12 on the protruding joint portion 13 of the silicon package unit 5a.

In the above-described electronic component device 2 in FIG. 5, the housing portion S is composed of the concave portion 11 of the silicon package unit 5a and the concave portion 51 of the cap package unit 50a in order to surely provide the sufficient height of the housing portion S. In the case where a relatively thin electronic component is mounted, the electronic component device 2 may have a structure in which the housing portion S is constructed by forming the concave portion 11 only on the side of the silicon package unit 5a, while a flat cap package unit is joined onto the protruding joint portion 13 of the silicon package unit 5a.

Alternatively, the electronic component device 2 may have an inverse structure in which the housing portion S is constructed by forming the concave portion 51 only on the side of the cap package unit 50a, while the protruding joint portion 53 of the cap package unit 50a is joined onto a flat silicon package unit.

The electronic component device 2 according to the second embodiment has the same effect as the first embodiment. In addition to this, in the second embodiment, base members are not joined together when the cap package unit is formed, unlike in the case of the first embodiment. By this matter, the cap package unit is integrally formed by processing a silicon wafer or the like. Thus, the manufacturing is made easy, particularly when the whole of the package is formed of silicon.

What is claimed is:

1. An electronic component device comprising:
   a silicon package unit including a silicon substrate, a through electrode provided in the silicon substrate, and an electrode post provided upright on an upper side of the silicon substrate and connected to the through electrode;
   an electronic component mounted on the electrode post, and having a connection terminal connected to a top end of the electrode post; and
   a cap package unit joined onto a periphery of the silicon package unit, and constructing a housing portion in which the electronic component is housed to be hermetically sealed.

2. The electronic component device according to claim 1, wherein
   the cap package unit is formed of a top plate and a frame-shaped silicon portion joined onto a periphery of a lower surface of the top plate, and
   a lower part of the frame-shaped silicon portion is joined onto the silicon package unit.

3. The electronic component device according to claim 2, wherein the top plate of the cap package unit is formed of any one of glass, silicon and ceramic.

4. The electronic component device according to claim 1, wherein
   the silicon package unit is provided with a concave portion in a central main portion thereof and a protruding joint portion on a periphery thereof,
   the cap package unit is provided with a concave portion and a protruding joint portion corresponding to the concave portion and the protruding joint portion of the silicon package unit, respectively, and
   the protruding joint portion of the cap package unit is joined onto the protruding joint portion of the silicon package unit.

5. The electronic component device according to claim 4, wherein the cap package unit is formed of any one of glass, silicon and ceramic.

6. The electronic component device according to claim 1, wherein
   the electronic component is constructed by mounting an MEMS device on a semiconductor chip, and
   the connection terminal disposed on a peripheral portion of the semiconductor chip is connected to the top end of the electrode post in a state that the MEMS device is arranged lower side.

7. The electronic component device according to claim 6, wherein the MEMS device is connected to the semiconductor chip through a wire.

8. The electronic component device according to claim 1, wherein the electrode post is formed of any one of copper and silicon.

9. The electronic component device according to claim 1, further comprising a wiring pattern formed on the lower surface of the silicon package unit and connected to the through electrode.

10. The electronic component device according to claim 1, wherein the height of the electrode post is within a range of 200 to 400 μm.

* * * * *